US006617198B2

United States Patent
Brooks

(10) Patent No.: US 6,617,198 B2
(45) Date of Patent: Sep. 9, 2003

(54) SEMICONDUCTOR ASSEMBLY WITHOUT ADHESIVE FILLETS

(75) Inventor: Jerry M. Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/909,943

(22) Filed: Jul. 23, 2001

(65) Prior Publication Data

US 2002/0094609 A1 Jul. 18, 2002

Related U.S. Application Data

(62) Division of application No. 09/760,741, filed on Jan. 17, 2001.

(51) Int. Cl.$^7$ .......................... H01L 21/00; H01L 21/44; H01L 21/48
(52) U.S. Cl. .......................................... 438/118; 156/60
(58) Field of Search ................................ 438/118, 124, 438/125, 126, 127, 123, 18, 108; 174/260; 156/60

(56) References Cited

U.S. PATENT DOCUMENTS

| 5,422,435 A | | 6/1995 | Takiar et al. |
| 5,548,091 A | * | 8/1996 | DiStefano et al. .......... 174/260 |
| 6,107,123 A | * | 8/2000 | Distefano et al. |

FOREIGN PATENT DOCUMENTS

| JP | 2001-124395 | * | 4/2000 | ......... H01L/25/065 |
| JP | 2001-094945 | * | 4/2001 | ......... H01L/25/065 |

* cited by examiner

Primary Examiner—William David Coleman
(74) Attorney, Agent, or Firm—Dickstein Shapiro Morin & Oshinsky LLP

(57) ABSTRACT

Disclosed is a method for forming a semiconductor assembly and the resulting assembly in which a flowable adhesive material which secures a die to a support and does not form an adhesive fillet. A flowable adhesive is deposited between the die and support so that it covers about 50 to about 90 percent of the bottom surface area of the die after the die is mounted to the support. The reduced surface coverage area prevents formation of an adhesive fillet.

6 Claims, 5 Drawing Sheets

SEMICONDUCTOR ASSEMBLY WITHOUT ADHESIVE FILLETS

This application is a divisional of application Ser. No. 09/760,741, filed on Jan. 17, 2001, the entirety of which is hereby incorporated by reference.

FIELD OF THE INVENTION

The present invention relates to a structure and method of forming a semiconductor assembly using adhesive materials to secure semiconductor dies to support elements without forming adhesive fillets.

BACKGROUND OF THE INVENTION

In order to reduce the size of semiconductor devices numerous techniques have been developed to vertically stack one semiconductor die, hereinafter "die", on top of another die. FIG. 1 illustrates a conventional method of vertically stacking two die 20, 30 on a support structure 10, such as a printed circuit board (PCB) or other thin support structure, to form a conventional semiconductor assembly 100. The first die 20 is shown secured to a support structure 10 by an adhesive material $22_a$ using techniques well known in the art. When the first die 20 is pressed against the support structure 10 the adhesive material $22_a$ is partially forced outside the die's 20 perimeter 29 and forms an adhesive fillet $24_a$. Likewise, when the second die 30 is secured against the first die 20 by an adhesive material $22_b$, a second adhesive fillet $24_b$ is also formed.

Both the first die 20 and second die 30 are shown wire bonded 40 to an electrical contact area 18 on the support structure 10. The first die 20 has an electrical contact area 28, such as a bonding pad, on its top surface 26. Because adhesive fillet $24_b$ is formed when the second die 30 is secured to the first die 20, it limits the placement of the first die's 20 electrical contact area 28. The distance B between the perimeter 39 of the second die 30 and a first die's 20 electrical contact area 28 must be increased by distance A, the width of the adhesive fillet $24_b$, to provide sufficient operating space for the wire bonding equipment. Typical dimensions for distances B are about 428 microns or greater to allow for adhesive fillets $24_b$, which are conventionally about 228 microns in width or greater. Using current wire bonding equipment, distance B between electrical contact area 28 and the perimeter of the fillet $24_b$ can be reduced to about 200 microns or less. In other words, adhesive fillet $24_b$ requires about 228 microns or more of first die's 20 top surface 26 on each side of the first die 20. If the adhesive fillet $24_b$ were eliminated the space could be used either to increase the size of the second die 30 or to reduce the size of the first die 20.

An alternative method of stacking dies 20, 30 to a support structure 10 to form a semiconductor assembly involves using an adhesive film sized and aligned with the respective die 20, 30 perimeters. Since the adhesive film is cut or dimensioned with the second die's perimeter 39, no adhesive fillet 24, as described above, is formed. However, adhesive films are expensive and are difficult to align with the dies 20, 30 and support structure 10. Accordingly, there is a need and desire for an easy, low-cost method of securing one or more semiconductor dies 20, 30 to various support structures 10 to form a semiconductor assembly 100 using adhesive materials 22 such that no adhesive fillets 24 are produced, for example, when a second die 30 is pressed and secured to a first semiconductor die 20 and when a first semiconductor die 20 is pressed and secured to a support structure 10.

SUMMARY OF THE INVENTION

The present invention provides a method to vertically stack at least one semiconductor die on top of another semiconductor die using an adhesive material without forming an adhesive fillet at the second die's perimeter. An adhesive material is deposited over about 50% to about 90% of the top surface of the first semiconductor die, such that when the second die is secured against the adhesive material and first die no adhesive material extends past the perimeter of the second die. Because no adhesive fillet is formed, the distance between the electrical contact areas on top of the first semiconductor die and the perimeter of the second die can be reduced.

BRIEF DESCRIPTION OF THE DRAWINGS

The foregoing and other advantages and features of the invention will become more apparent from the detailed description of the preferred embodiments given below with reference to the accompanying drawings in which.

DETAILED DESCRIPTION OF THE PREFERRED EMBODIMENTS

The invention provides a method and resulting structure for a semiconductor assembly with no adhesive fillet formed when a semiconductor die is secured by adhesive to a supporting structure. The invention will be described as set forth in the exemplary embodiments of the detailed description and as illustrated in FIGS. 2–7. These embodiments are described with sufficient detail to enable those skilled in the art to practice the invention, and it is to be understood that other embodiments may be employed, and that structural changes may be made without departing from the spirit or scope of the invention. The invention is not limited by the description of the exemplary embodiments.

Figure 2:
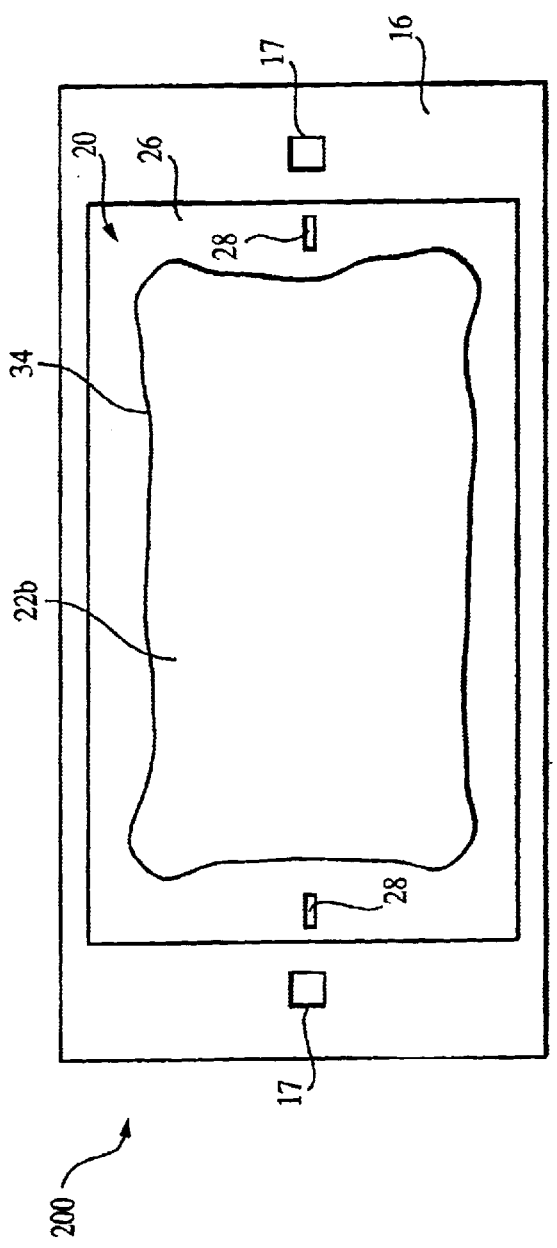
FIG. 2 is a plan view of a partially fabricated semiconductor die stack on a support structure according to the present invention.
Figure 3:
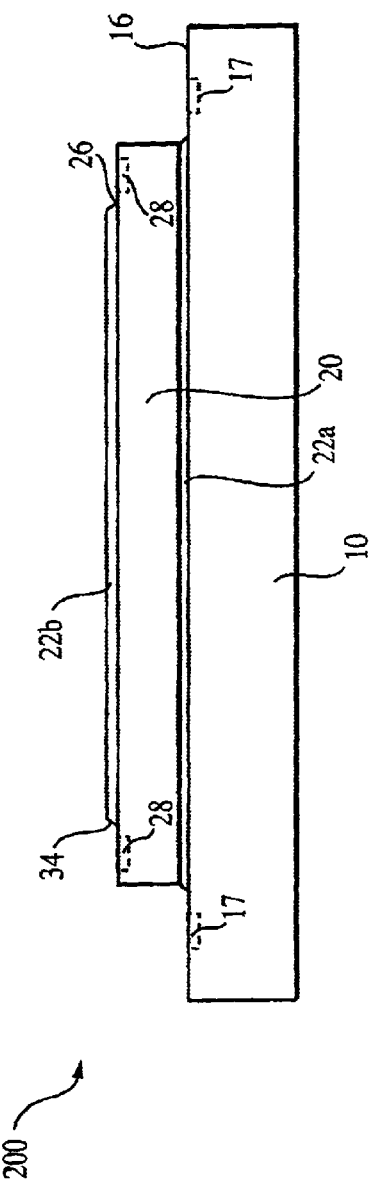
FIG. 3 is an elevation view of FIG. 2.

Referring now to the drawings, where like elements are designated by like reference numerals, FIGS. 2–3, illustrate a plan and elevation view respectively of a partially completed semiconductor assembly 200 in which a first semiconductor die 20 is secured to the top surface 16 of supporting structure 10, by a first adhesive layer $22_a$. Supporting structure 10 in an exemplary embodiment is a printed circuit board or thin film, but may be any structure suitable for supporting a semiconductor die. The supporting structure 10 is shown as having two electrical contact areas 17 on surface 16 and the first die 20 is also shown as having two electrical contact areas 28. It is to be understood that any number of electrical contact areas 17, 28 may be provided on the support structure 10 and first die 20. Also, although FIG. 2 shows the contact areas 17, 28 as recessed, they may also be formed on the surface of the support structure 10 or first die 20, respectively, and could be electrically connected to external electrical paths or to other parts of the completed semiconductor assembly 200.

A second adhesive layer $22_b$ is shown in FIG. 2 as deposited on a top surface 26 of the first semiconductor die 20 within an adhesive layer area defined by a perimeter 34. The second adhesive layer $22_b$ can be deposited by techniques well-known in the art to include various patterns and coverage areas. It is to be understood that perimeter 34 is representative of an area of deposition of the second adhesive layer $22_b$; however it is not limiting. In accordance with the invention a sufficient amount of adhesive material should be deposited to adequately secure a second semiconductor die 30 (see FIGS. 4–5) to the first semiconductor die 20. The invention includes any coverage area or pattern that does not exceed the perimeter of the second die 30. As described below, when the second die 30 is placed and pressed on the first die 20, the adhesive layer $22_b$ represented inside of the adhesive perimeter 34 does not extend past the profile or perimeter 39 of the second die 30 (FIGS. 4–5).

Figure 4:
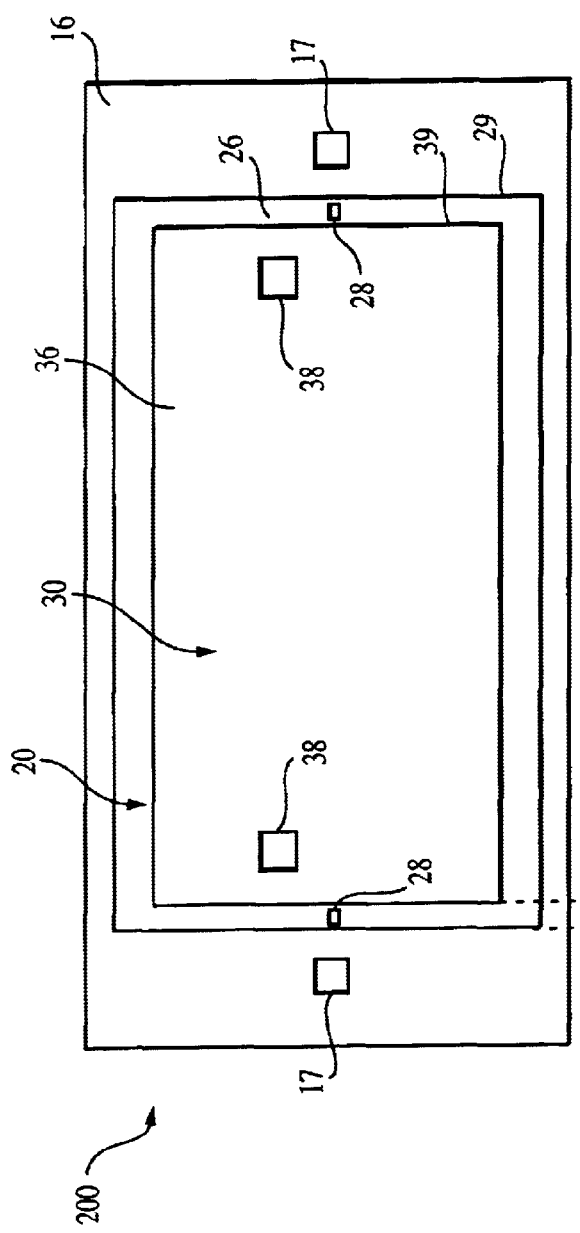
FIG. 4 is a plan view of a partially fabricated semiconductor die stack at a stage of processing subsequent to that shown in FIGS. 2 and 3.
Figure 5:
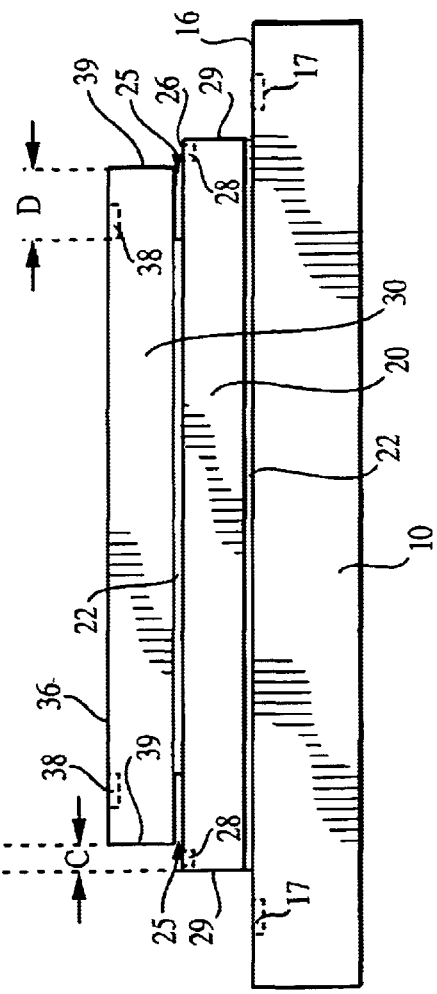
FIG. 5 is an elevation view of FIG. 4.

FIGS. 4–5 show the assembly 200 after a second die 30 with electrical contact areas 38 on the die's top surface 36 is pressed against the second adhesive layer $22_b$ located on the top surface 26 of the first die 20. A cavity 25 is formed between the dies 20 and 30 and is characterized by a distance D between the perimeter 34 of the second adhesive layer $22_b$ and the perimeter 39 of the second die 30. The distance D may be a regular or irregular distance around the periphery of the adhesive layer $22_b$. It is to be understood that formation of cavity 25 is not essential, what is important is that adhesive layer $22_b$ does not extend beyond the perimeter 39 of the second die 30 such that no adhesive fillet $24_b$ is formed.

Figure 6:
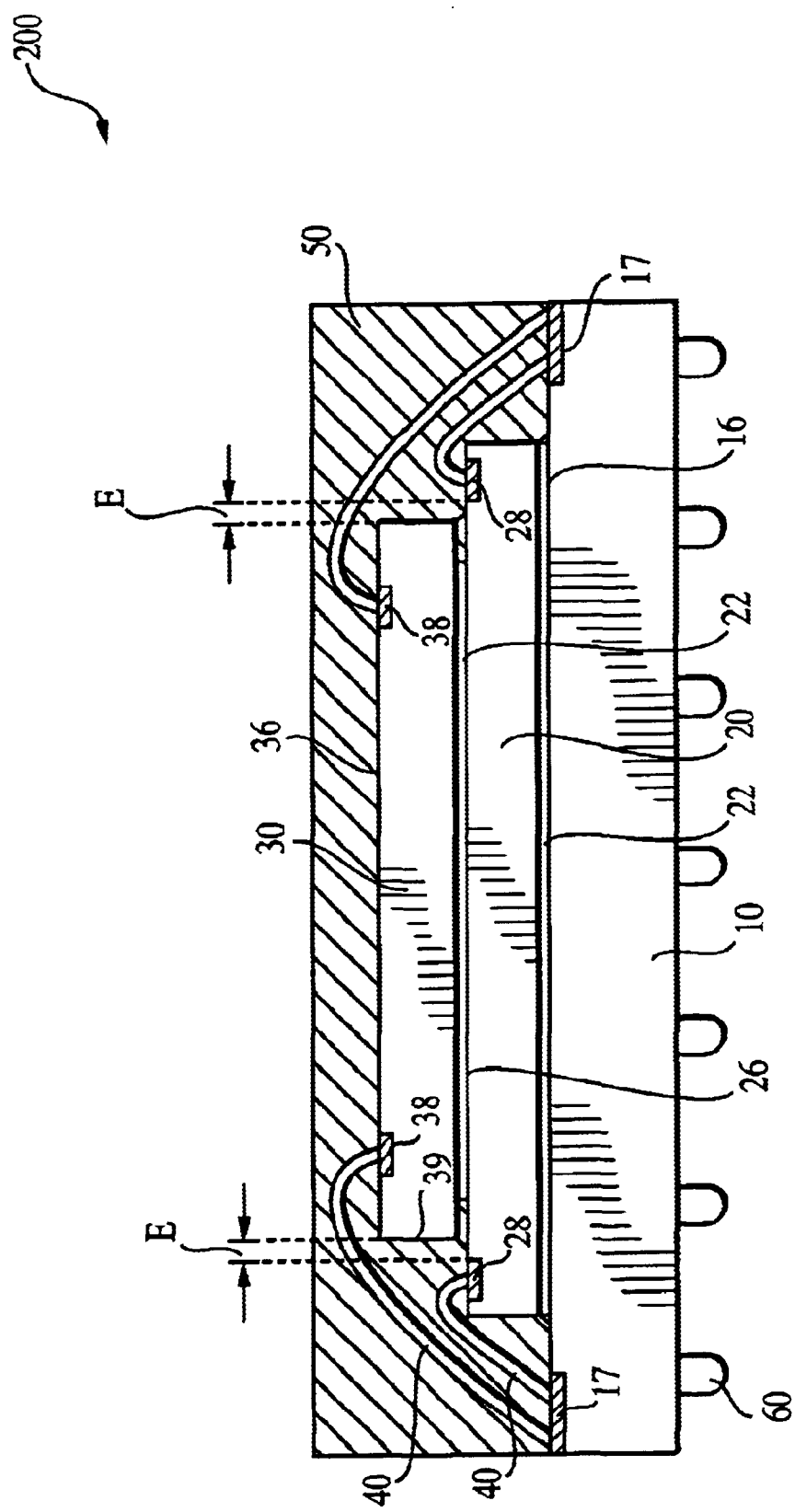
FIG. 6 is a cross-sectional illustration of an encapsulated semiconductor die stack formed according to a method of the present invention.

If cavity 25 is present, the distance D is preferably in the range such that between about 50 and about 90 percent of the second die 30 bottom surface is covered by the second adhesive material layer $22_b$. FIGS. 4 and 5 show distance C between the perimeter 39 of the second die 30 and the perimeter 29 of the first die 20. This distance is a value which provides acceptable clearance between electrical contact area 28 and the second die 30 to enable the formation of electrical contacts between the dies 20, 30 and other parts of the assembly 200 such as wire bonds 40 between the dies 20, 30 and the support structure 10 (FIG. 6). An exemplary distance C between the perimeters 29, 39 of the first die 20 and second die 30 is about 200 microns or less. The distance C is currently only limited by the technology of the wire bond equipment and the minimum required operating space.

FIG. 6 is a cross-sectional illustration of the semiconductor assembly 200 after electrical connections 40 have been made between the respective electrical contact areas 28 and 38 of the first die 20 and second die 30 and electrical contact areas 17 of the support structure 10. In an exemplary embodiment, wire bonding is used for these connections. As illustrated, the dies 20, 30 are stacked and positioned in such a manner that at least one of the electrical contact areas 28, 38 for each die 20, 30 is exposed and accessible for making the electrical connection. Illustrated distance E represents the distance between the first die's electrical contact area 28 and the perimeter 39 of the second die 30.

Also shown are balls 60 which make up a ball grid array pattern for making electrical connections between the support structure 10 and external electrical circuits. The balls 60 are deposited on the support structure 10 using materials and techniques well known in the art and are electrically connected through conductors supported by support structure 10 to the contact areas 17. It is to be understood that multiple semiconductor assemblies 200 could be prepared at one time on a continuous support structure 10, which could be separated into individual or multiple semiconductor assemblies 200 at a later stage of fabrication.

FIG. 6 also shows an encapsulating material 50, such as a molding compound, deposited over the wire bonds 40, semiconductor dies 20, 30, and top surface 16 of the support structure 10. As an exemplary illustration, some of the encapsulation material 50 is shown under the second die 30 and within cavity 25 (FIGS. 4–5) and provides support and stability to the second die 30. The encapsulating material 50 and molding techniques using it are well known in the art and not repeated herein.

Figure 1:
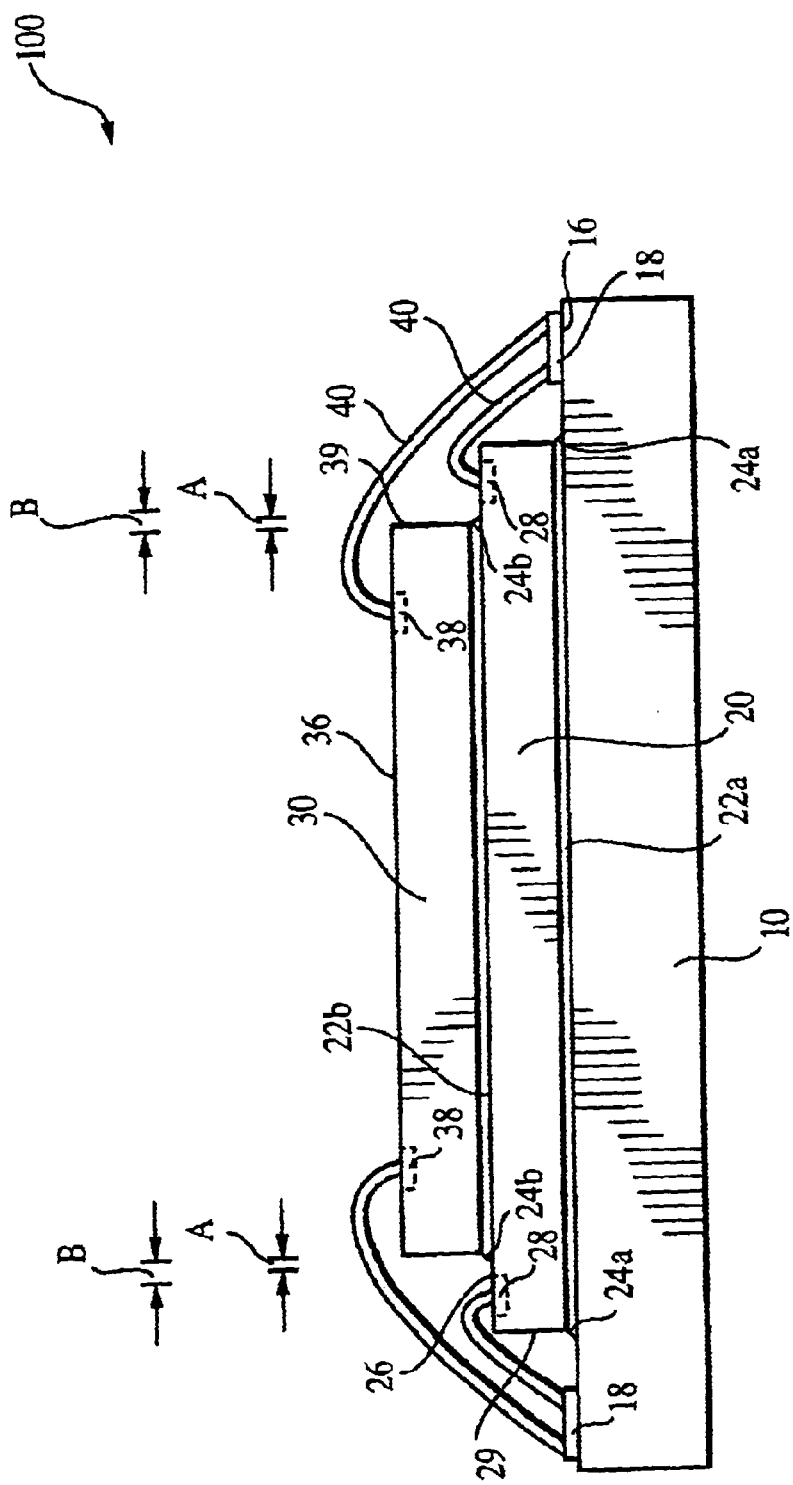
FIG. 1 is an illustration of a conventional structure in which two stacked semiconductor die are secured to a support structure by an adhesive material.
Figure 7:
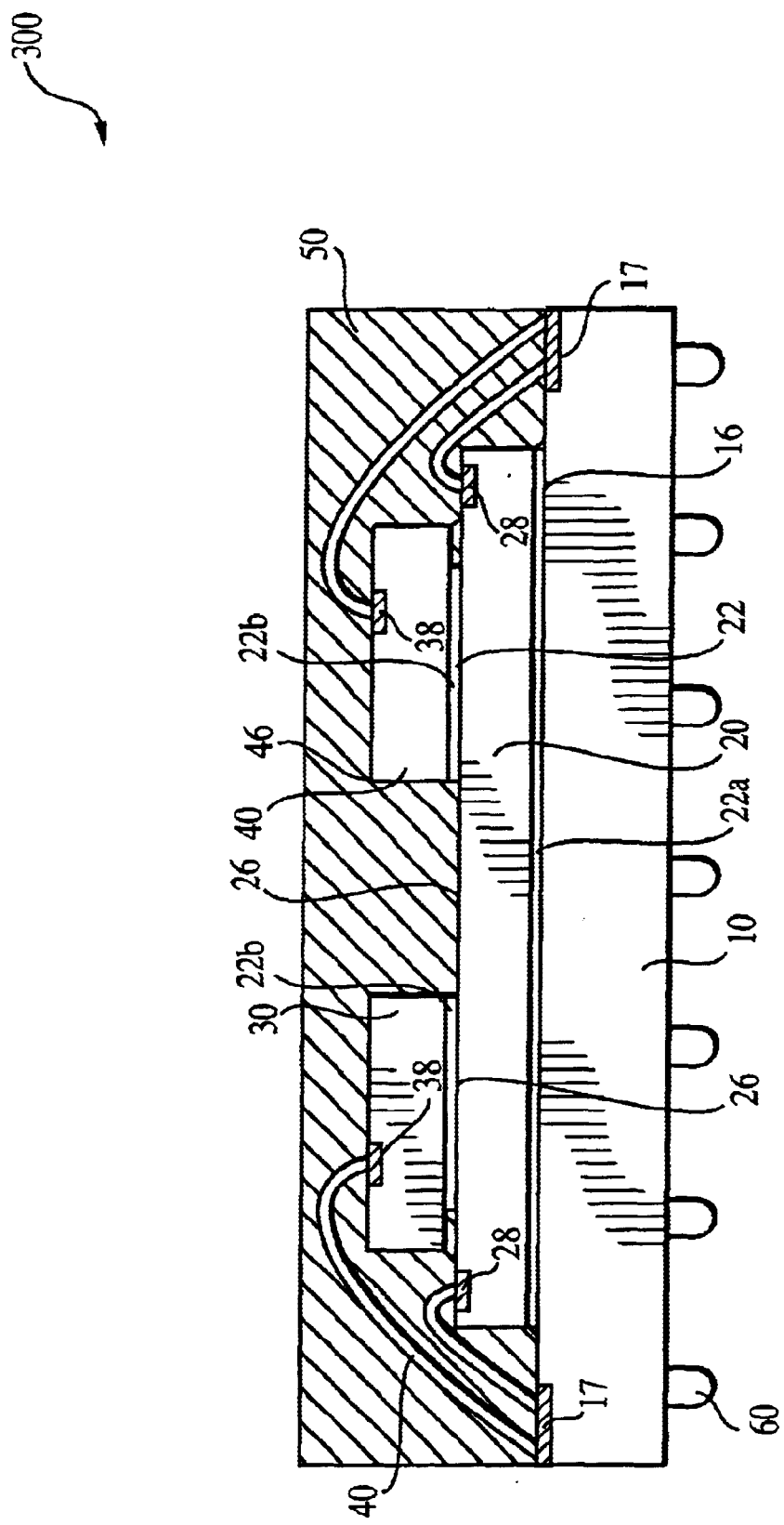
FIG. 7 is an exemplary embodiment of two semiconductor dies stacked on top of a semiconductor die according to a method of the present invention.

FIG. 7 is a cross-sectional illustration of a second exemplary embodiment of a semiconductor assembly 300 with second and third semiconductor dies 30, 45 secured to a first semiconductor die 20 using the techniques described above. It is to be understood that the elimination of the adhesive fillet $24_b$, as discussed in FIG. 1 covers a wide range of semiconductor configurations involving multiple dies with various sizes, dimensions, and electrical contact techniques. The above described invention has the advantage of allowing either the size of the second and third semiconductor dies 30, 45 to be increased or allowing the size of the first semiconductor die 20 to be reduced by eliminating the wasted space occupied by the adhesive fillet $24_b$.

Having thus described in detail the exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method of forming a semiconductor assembly comprising the steps of:

providing a first semiconductor die having a top and bottom surface and at least one electrical contact area adjacent an edge of said top surface;

providing a second semiconductor die having a top and bottom surface;

depositing a flowable adhesive material on said top surface of said first die so that said flowable adhesive material covers an area no less than or equal to about 50% and no greater than or equal to about 90% of said second die bottom surface area;

pressing said second die against said first die so that said flowable adhesive material flows but does not extend past the perimeter of said second die.

2. The method of claim 1, further comprising the steps of securing said bottom surface of said first die to a support structure.

3. The method of claim 2, where said support structure is a printed circuit board.

4. The method of claim 2, where said support structure is a film.

5. The method of claim 1, wherein said flowable adhesive material is an epoxy.

6. A method of forming a semiconductor assembly comprising the steps of:

provinding a first semiconductor die having a top and bottom surface and at least one electrical contact area adjacent an edge of said top surface;

providing a second semiconductor die having a top and bottom surface;

depositing a flowable adhesive material on said bottom surface of said second die so that said flowable adhesive material covers an area greater than or equal to about 50% and less than or equal to about 90% of said second die bottom surface area;

pressing said second die against said first die so that said flowable adhesive material flows out but does not extend past the perimeter of said second die.

* * * * *

UNITED STATES PATENT AND TRADEMARK OFFICE
CERTIFICATE OF CORRECTION

PATENT NO.    : 6,617,198 B2                                         Page 1 of 1
DATED         : September 9, 2003
INVENTOR(S)   : Mike Brooks It is certified that error appears in the above-identified patent and that said Letters Patent is hereby corrected as shown below:

Title page,
Item [56], References Cited, FOREIGN PATENT DOCUMENTS,
"JP 2001-094945" should read -- JP 2001-094045 --
"JP 2001-124395" should read -- JP 2000-124395 --

Signed and Sealed this

Twenty-fifth Day of May, 2004

JON W. DUDAS
*Acting Director of the United States Patent and Trademark Office*